(12) United States Patent
Prushinskiy et al.

(10) Patent No.: US 9,274,559 B2
(45) Date of Patent: Mar. 1, 2016

(54) FLEXIBLE DISPLAY APPARATUS AND METHOD OF MANUFACTURING THE SAME

(75) Inventors: Valeriy Prushinskiy, Yongin (KR); Won-Sik Hyun, Yongin (KR); Hyong-Yeol Na, Yongin (KR); Min-Soo Kim, Yongin (KR); Mu-Gyeom Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 616 days.

(21) Appl. No.: 13/472,374

(22) Filed: May 15, 2012

(65) Prior Publication Data

US 2013/0169515 A1    Jul. 4, 2013

(30) Foreign Application Priority Data

Dec. 28, 2011  (KR) .......................... 10-2011-0144982

(51) Int. Cl.
*G09G 3/20*   (2006.01)
*G06F 1/16*   (2006.01)

(52) U.S. Cl.
CPC .......... *G06F 1/1652* (2013.01); *G09G 2380/02* (2013.01)

(58) Field of Classification Search
CPC ........ G09G 3/20; G09G 3/00; G02F 1/13333; H01J 1/62
USPC .............. 345/55, 173, 156; 361/681; 313/504
See application file for complete search history.

(56) References Cited

U.S. PATENT DOCUMENTS

| 7,828,618 | B2 | 11/2010 | Park et al. |
| 8,294,869 | B2 * | 10/2012 | Yamaguchi et al. .......... 349/160 |
| 2004/0124763 | A1 | 7/2004 | Nathan et al. |
| 2006/0028128 | A1 | 2/2006 | Ohkubo |
| 2006/0243267 | A1 * | 11/2006 | Nakajima et al. ........... 126/25 R |
| 2008/0055831 | A1 * | 3/2008 | Satoh ............................ 361/681 |
| 2008/0277375 | A1 * | 11/2008 | Paek ....................... G02F 1/167 216/17 |
| 2009/0278449 | A1 * | 11/2009 | Choi et al. .................... 313/504 |
| 2010/0308335 | A1 | 12/2010 | Kim et al. |
| 2011/0134144 | A1 * | 6/2011 | Moriwaki ............ G09G 3/3208 345/660 |
| 2013/0300686 | A1 * | 11/2013 | Yoon ...................... G06F 3/041 345/173 |

FOREIGN PATENT DOCUMENTS

| JP | 2005-251671 A | 9/2005 |
| JP | 2008-152107 A | 7/2008 |
| KR | 10-2006-0004319 A | 1/2006 |
| KR | 10-2010-0130898 A | 12/2010 |

* cited by examiner

*Primary Examiner* — Quan-Zhen Wang
*Assistant Examiner* — Yuk Chow
(74) *Attorney, Agent, or Firm* — Lewis Roca Rothgerber Christie LLP

(57) ABSTRACT

A flexible display apparatus including: a first film including a first surface and a second surface that are opposite each other, and a first groove formed in the first surface, the first film having a first rigidity; a third film on the second surface of the first film; a fourth film facing the third film; an emission display unit between and encapsulated by the third film and the fourth film; and a second film on the fourth film and facing the first film, the second film having a second rigidity that is less than the first rigidity.

20 Claims, 9 Drawing Sheets

FLEXIBLE DISPLAY APPARATUS AND METHOD OF MANUFACTURING THE SAME

CROSS-REFERENCE TO RELATED APPLICATION

This application claims priority to and the benefit of Korean Patent Application No. 10-2011-0144982, filed on Dec. 28, 2011 in the Korean Intellectual Property Office, the entire content of which is incorporated herein by reference.

BACKGROUND

1. Field

Aspects of embodiments of the present invention relate to a flexible display apparatus and a method of manufacturing the same.

2. Description of the Related Art

A display apparatus is an apparatus that displays an image signal. The display apparatus is any apparatus that displays an image signal received from an external source and includes televisions, computer monitors, personal digital assistants (PDAs), smart devices that are recently in great demand, or the like.

For the display apparatus, a high-definition flat display module including an organic light-emitting display panel, a liquid crystal display panel, a plasma display panel, an electrophoretic display panel, or the like is used.

Recently, a flexible display apparatus that is lightweight, slim, and portable, and that may be bent or folded is being developed. The flexible display apparatus may be embodied by using a flexible substrate such as a plastic, instead of using a glass substrate.

However, a shape of the flexible substrate is not fixed but is flexible, such that it is difficult to precisely form various types of devices and wirings included in the display apparatus.

Also, since a stress exceeding a breaking strength due to excessive bending or a repetitive stress due to repetitive bending may be applied to the display apparatus, a lifetime of the display apparatus is decreased, and the devices and wirings are damaged.

SUMMARY

According to an aspect of embodiments of the present invention, a flexible display apparatus has a decreased stress occurring in a bending portion when the flexible display apparatus is folded or bent.

According to one embodiment of the present invention, a flexible display apparatus includes: a first film including a first surface and a second surface that are opposite each other, and a first groove formed in the first surface, the first film having a first rigidity; a third film on the second surface of the first film; a fourth film facing the third film; an emission display unit between and encapsulated by the third film and the fourth film; and a second film on the fourth film and facing the first film, the second film having a second rigidity that is less than the first rigidity.

The flexible display apparatus may include a neutral portion in which a tensile stress and a compressive stress are not incurred by a force when the force capable of bending the flexible display apparatus is applied to the flexible display apparatus, and the emission display unit may be positioned at the neutral portion.

The flexible display apparatus may further include a bending portion configured to be bent, and the first groove may be positioned at the bending portion.

The first groove may include a plurality of grooves.

The first groove may have a V-shape.

A depth $h_1$ of the first groove may satisfy an equation:

$$0 < h_1 \le t_1,$$

where $t_1$ is a thickness of the first film.

The first film may be divided by the first groove into a first region and a second region, and a portion of the third film may be exposed at a region corresponding to the first groove.

The flexible display apparatus may further include an elastic member in the first groove.

The second film may include a third surface adjacent to the fourth film, and a fourth surface opposite the third surface and having a second groove formed therein.

The third film may have flexibility, and the fourth film may be formed as a thin film including a multi-layered inorganic film, or an inorganic film and an organic film.

According to another embodiment of the present invention, a method of manufacturing a flexible display apparatus includes: forming a third film on a supporting substrate; forming an emission display unit on the third film; forming a fourth film on the emission display unit; forming a second film having a second rigidity on the fourth film; separating the supporting substrate from the third film; and forming a first film on a surface of the third film opposite to another surface of the third film on which the emission display unit is formed, wherein the first film has a first rigidity greater than the second rigidity and includes a second surface adjacent to the third film, and a first surface that is opposite to the second surface and has a first groove.

The flexible display apparatus may include a neutral portion in which a tensile stress and a compressive stress are not incurred by a force when the force capable of bending the flexible display apparatus is applied to the flexible display apparatus, and the emission display unit may be positioned at the neutral portion.

Forming the first film may include forming the first film having the first groove such that the first groove is positioned at a bending portion formed in the flexible display apparatus to allow the flexible display apparatus to be bent.

The first groove may include a plurality of grooves.

The first groove may have a V-shape.

A depth $h_1$ of the first groove may satisfy an equation:

$$0 < h_1 \le t_1,$$

where $t_1$ is a thickness of the first film.

The first film may be divided by the first groove into a first region and a second region, and a portion of the third film may be exposed at a region corresponding to the first groove.

The method may further include forming an elastic member in the first groove.

The second film may include a third surface adjacent to the fourth film, and a fourth surface opposite the third surface and having a second groove formed therein.

The third film may have flexibility, and the fourth film may be formed as a thin film including a multi-layered inorganic film, or an inorganic film and an organic film.

BRIEF DESCRIPTION OF THE DRAWINGS

The above and other features and aspects of the present invention will become more apparent by describing in further detail some exemplary embodiments thereof with reference to the attached drawings in which.

DETAILED DESCRIPTION

Some exemplary embodiments of the present invention are described more fully hereinafter with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

As used herein, the term "and/or" includes any and all combinations of one or more of the associated listed items.

Figure 1:
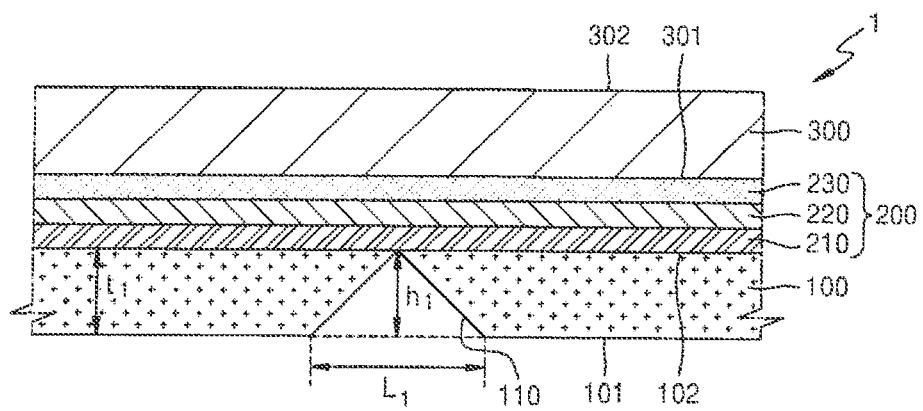
FIG. 1 is a cross-sectional view of a flexible display apparatus according to an embodiment of the present invention.
Figure 2:
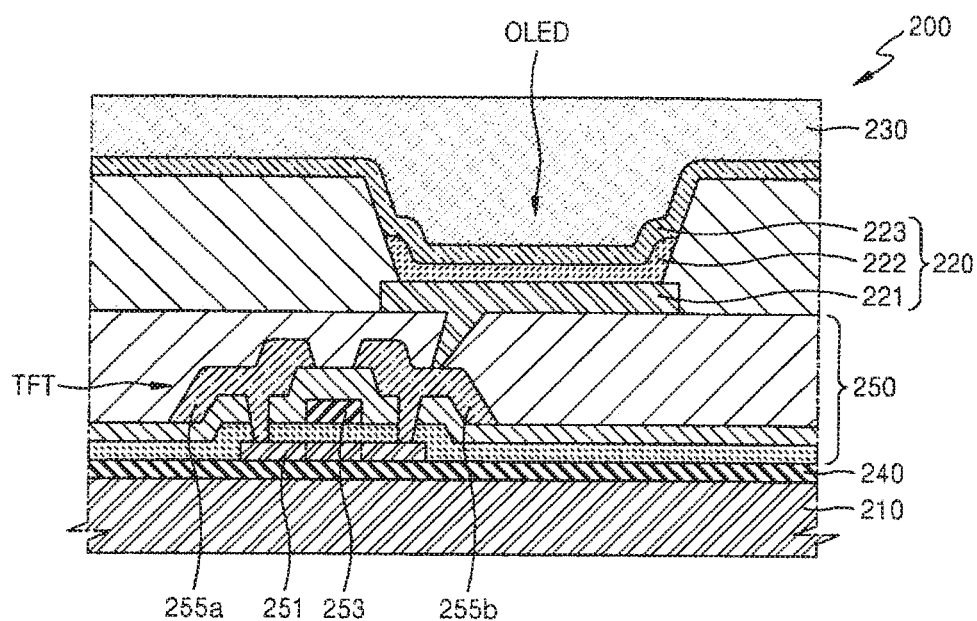
FIG. 2 is a cross-sectional view of a pixel region of a display panel unit of the flexible display apparatus of FIG. 1.

FIG. 1 is a cross-sectional view of a flexible display apparatus 1 according to an embodiment of the present invention. FIG. 2 is a cross-sectional view of a pixel region of a display panel unit 200 of the flexible display apparatus 1 of FIG. 1.

Referring to FIG. 1, the flexible display apparatus 1, in one embodiment, includes a first film 100 having a first surface 101 and a second surface 102 that are opposite each other, having a first groove 110 formed in the first surface 101, and having a first rigidity. The flexible display apparatus 1, in one embodiment, further includes the display panel unit 200 including a third film 210 disposed on the second surface 102 of the first film 100, a fourth film 230 disposed to face the third film 210, and an emission display unit 220 interposed between the third film 210 and the fourth film 230, and encapsulated by the third film 210 and the fourth film 230. The flexible display apparatus 1, in one embodiment, further includes a second film 300 disposed on the fourth film 230 so as to face the first film 100, and having a second rigidity that is less than the first rigidity of the first film 100.

The first film 100 and the second film 300 may be formed of a plastic, and the second film 300 has flexibility. The first film 100 may be formed of a material having a rigidity greater than a rigidity of the second film 300. Although the first film 100 may have flexibility, the first film 100, in one embodiment, has a rigidity greater than the rigidity of the second film 300.

By forming the first film 100 of a material having a relatively greater rigidity, durability of the flexible display apparatus 1 may be improved, and damage to the display panel unit 200 may be prevented or substantially prevented.

In one embodiment, the first film 100 and the second film 300 are formed of a plastic, but a material of the first film 100 and the second film 300 is not limited thereto, and, in other embodiments of the present invention, the first film 100 and the second film 300 may be formed of various other materials.

The flexible display apparatus 1 may be bent in such a manner that the first film 100 having relatively greater rigidity, i.e. having relatively less flexibility, may be disposed at an inner side, and a tensile stress may be applied to the second film 300, and a compressive stress may be applied to the first film 100.

The flexible display apparatus 1 may be repetitively bent due to an external force, and when a stress greater than or equal to a breaking strength is applied to the display panel unit 200, the display panel unit 200 may be damaged. In order to decrease a stress occurring in the flexible display apparatus 1, the first film 100 has the first groove 110 that is formed in the first surface 101.

In order to avoid or decrease the compressive stress applied to the first film 100, the first groove 110 may be positioned at a bending portion (i.e. a portion B in each of FIGS. 3 and 4) of the flexible display apparatus 1, i.e. at a region having the greatest stress.

The display panel unit 200 is disposed between the first film 100 and the second film 300.

Referring to FIG. 2, in one embodiment, the display panel unit 200 may include the third film 210 having flexibility and disposed on the second surface 102 of the first film 100, the emission display unit 220 disposed on the third film 210, and the fourth film 230 that is disposed on the emission display unit 220 so as to face the third film 210 and that, together with the third film 210, encapsulates the emission display unit 220. In one embodiment, a barrier layer 240 and a device/wiring layer 250 may be further disposed between the third film 210 and the emission display unit 220.

The third film 210, in one embodiment, may be formed of a plastic material including polyethylene ether phthalate, polyethylene naphthalate (PEN), polycarbonate, polyetherimide, polyether sulfone, polyimide, or the like. However, one or more embodiments of the present invention are not limited thereto, and the third film 210 may be formed of various other flexible materials.

The barrier layer 240, in one embodiment, may be disposed on the third film 210. The third film 210 prevents or substantially prevents foreign substances such as moisture or oxygen from passing through the third film 210 and then penetrating into a thin film transistor (TFT) and/or the emission display unit 220.

The device/wiring layer 250, in one embodiment, may be disposed on the barrier layer 240 and may include a driving TFT for driving the emission display unit 220 (i.e. an organic light-emitting diode (OLED)), a switching TFT (not shown), a capacitor, and wirings (not shown) that are connected to the TFT or the capacitor.

The driving TFT includes an active layer 251, a gate electrode 253, and source and drain electrodes 255*a* and 255*b*.

The emission display unit 220, in one embodiment, is disposed on the device/wiring layer 250. The emission display unit 220 includes a pixel electrode 221, an organic emission layer 222 disposed on the pixel electrode 221, and an opposite electrode 223 formed on the organic emission layer 222.

In one embodiment, the pixel electrode 221 is an anode, and the opposite electrode 223 is a cathode. However, one or more embodiments of the present invention are not limited thereto and thus, according to a method of driving the flexible display apparatus 1, the pixel electrode 221 may be a cathode, and the opposite electrode 223 may be an anode. Holes and electrons that are output from the pixel electrode 221 and the opposite electrode 223, respectively, are injected into the organic emission layer 222. The injected holes and electrons form excitons, and when the excitons turn to an excited state from a ground state, light is emitted.

The pixel electrode 221 is electrically connected to the driving TFT formed in the device/wiring layer 250.

In one embodiment, the emission display unit 220 is disposed on the device/wiring layer 250 in which the driving TFT is formed. However, one or more embodiments of the present invention are not limited thereto, and thus the structure may be variously changed to a structure in which the pixel electrode 221 of the emission display unit 220 is formed on the same layer as the active layer 251 of the TFT, a structure in which the pixel electrode 221 is formed on the same layer as the gate electrode 253, a structure in which the pixel electrode 221 is formed on the same layer as the source and the drain electrodes 255a and 255b, or the like.

Also, in the driving TFT according to one embodiment, the gate electrode 253 is disposed on the active layer 251. However, one or more embodiments of the present invention are not limited thereto, and thus the gate electrode 253 may be disposed below the active layer 251.

The pixel electrode 221 included in the emission display unit 220 may be a reflective electrode, and may include a reflective layer formed of Ag, Mg, Al, Pt, Pd, Au, Ni, Nd, Ir, Cr, or a compound of any of these, and a transparent or translucent electrode layer may be formed on the reflective layer.

The transparent or translucent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 223 that is disposed to face the pixel electrode 221 may be a transparent or translucent electrode, and may be formed of a metal thin film having a low work function and including a material Li, Ca, LiF/Ca, LiF/Al, Al, Ag, Mg, or a compound of any of these. Also, an auxiliary electrode layer or a bus electrode may be further formed on the metal thin film, wherein the auxiliary electrode layer or the bus electrode may be formed of a material including ITO, IZO, ZnO or $In_2O_3$ for the transparent or translucent electrode.

Thus, the opposite electrode 223 may transmit light emitted from the organic emission layer 222.

The organic emission layer 222 is disposed between the pixel electrode 221 and the opposite electrode 223, and the organic emission layer 222 may be a small-molecule organic layer or a polymer organic layer.

In addition to the organic emission layer 222, intermediate layers including a hole transport layer (HTL), a hole injection layer (HIL), an electron transport layer (ETL), an electron injection layer (EIL), or the like may be selectively disposed between the pixel electrode 221 and the opposite electrode 223.

The flexible display apparatus 1 may be a top emission type flexible display apparatus in which light emitted from the organic emission layer 222 is directly emitted or is reflected by the pixel electrode 221 formed as the reflective electrode, and then travels to the opposite electrode 223.

However, a type of the flexible display apparatus 1 is not limited to the top emission type flexible display apparatus, and thus may be a bottom emission type flexible display apparatus in which light generated in the organic emission layer 222 is emitted to the third film 210. In this case, the pixel electrode 221 may be formed as a transparent or translucent electrode, and the opposite electrode 223 may be formed as a reflective electrode.

In one embodiment, the flexible display apparatus 1 may be a dual-emission type flexible display apparatus in which light is emitted to a top surface and a bottom surface.

The fourth film 230 may be disposed on the opposite electrode 223. The fourth film 230 may be formed as a multi-layered inorganic film, or a thin film including an inorganic film and an organic film. The fourth film 230 may function to prevent or substantially prevent penetration of external moisture and oxygen into the emission display unit 220.

The flexible display apparatus 1 according to one embodiment includes the display panel unit 200 including the third film 210 having flexibility, and the fourth film 230 formed as a thin film, the first film 100 having the first groove 110, and the second film 300 having flexibility, such that the flexible display apparatus 1 may have flexibility and slimness.

When an external force is applied to the flexible display apparatus 1 so as to bend the flexible display apparatus 1, a tensile stress is applied to the second film 300 disposed at an outer side of the bending portion B, and a compressive stress is applied to the first film 100 disposed at an inner side of the bending portion B.

In one embodiment, a neutral portion in which neither the tensile stress nor the compressive stress occurs exists between the first film 100 and the second film 300. When the emission display unit 220 is disposed in the neutral portion, a stress applied to the emission display unit 220 is minimized or reduced such that damage due to bending may be prevented or substantially prevented.

In one embodiment, in order to avoid or decrease the compressive stress applied to the first film 100, the first groove 110 is formed in the first surface 101 of the first film 100. The first groove 110 may be positioned at the bending portion B, i.e. the region to which the greatest stress is applied when the flexible display apparatus 1 is bent.

In one embodiment, the first groove 110 may have a V-shape. In this regard, a width $L_1$ and a depth $h_1$ of the V-shape may have various values according to a bending amount.

In one embodiment, the depth $h_1$ may satisfy the equation of $0 < h_1 \leq t_1$. Here, $t_1$ is a thickness of the first film 100.

In one embodiment, the first groove 110 is formed as a single groove. However, one or more embodiments of the present invention are not limited thereto, and thus a plurality of the first grooves 110 may be formed.

In one embodiment, the second film 300 may have a third surface 301 adjacent to the display panel unit 200, and a fourth surface 302 opposite to the third surface 301.

In the flexible display apparatus 1 according to one embodiment, the first film 100 having a relatively great rigidity is disposed below the display panel unit 200, i.e. is disposed toward the third film 210, and the second film 300 having great flexibility is disposed on the display panel unit 200, i.e. is disposed toward the fourth film 230. However, in another embodiment, disposition of the first film 100 and the second film 300 may be reversed.

In one embodiment, the first film 100 and/or the second film 300 disposed in an emission direction may include a polarizing film.

Also, while the emission display unit 220 of the display panel unit 200 included in the flexible display apparatus 1 includes the organic emission layer 222, one or more embodiments of the present invention are not limited thereto, and thus the display panel unit 200 may include a liquid crystal display (LCD) device, a plasma display device, an electrophoretic display device, or the like.

Figure 3:
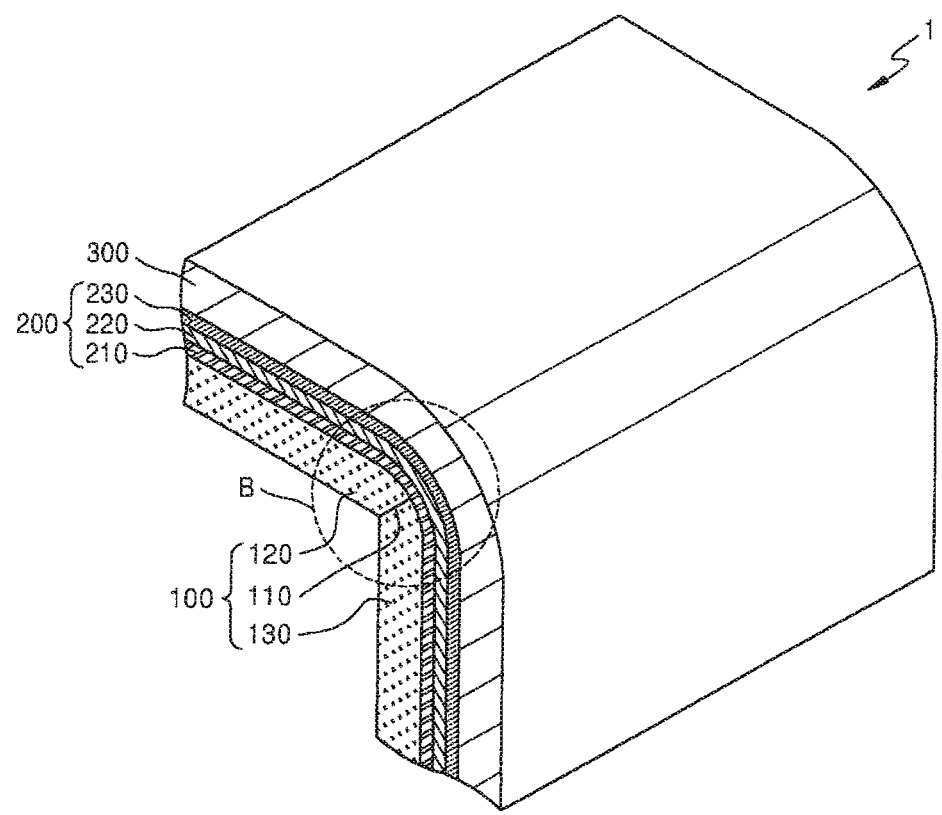
FIGS. 3 and 4 are perspective views illustrating bent states of the flexible display apparatus of FIG. 1.
Figure 4:
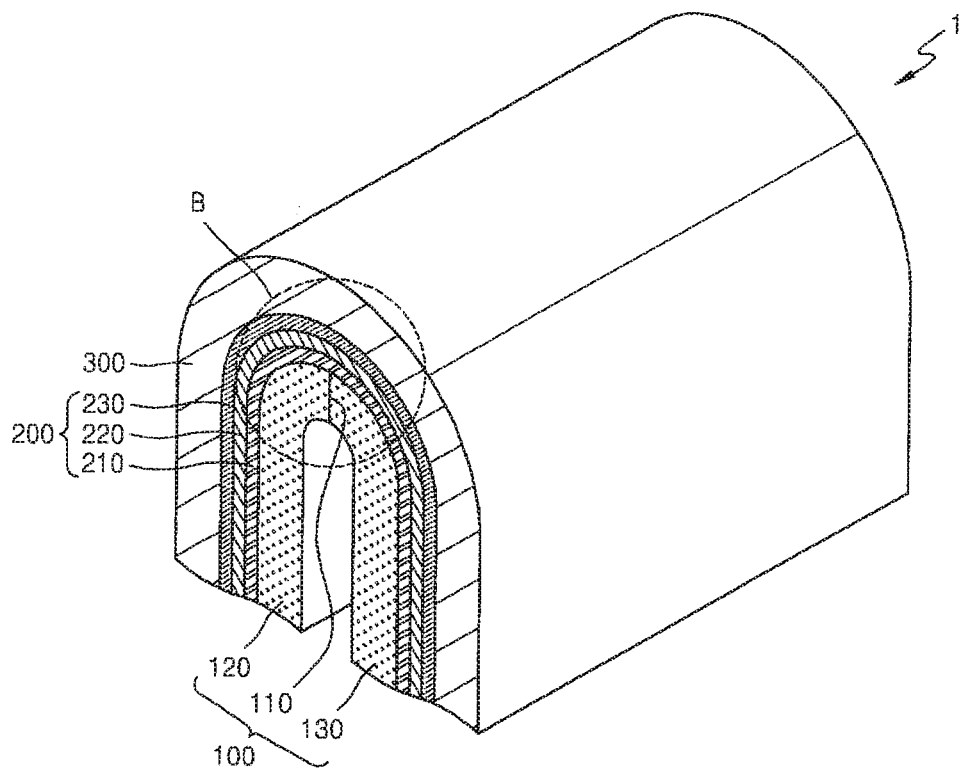

FIGS. 3 and 4 are perspective views illustrating bent states of the flexible display apparatus 1 of FIG. 1.

Referring to FIG. 3, the first film 100 includes a first region 120 and a second region 130, and the flexible display apparatus 1 includes the bending portion B at which the first region 120 and the second region 130 of the first film 100 are bent in an approximately vertical direction.

The first groove 110 is formed at a region of the first film 100 which corresponds to the bending portion B, and, in one embodiment, a width $L_1$ of the first groove 110 may be twice as great as the thickness $t_1$ of the first film 100, i.e. $L_1=2\times t_1$, and the depth $h_1$ may be the same as the thickness $t_1$ of the first film 100, i.e. $h_1=t_1$.

As a result of the aforementioned structure, although the flexible display apparatus 1 may be bent as shown in FIG. 3, a compressive stress is not applied to the first film 100.

Referring to FIG. 4, the first film 100 includes the first region 120 and the second region 130, and the flexible display apparatus 1 includes the bending portion B at which the first region 120 and the second region 130 of the first film 100 are bent in an approximately horizontal direction.

In one embodiment, the width $L_1$ of the first groove 110 formed in the first film 100 may be at least two times greater than the thickness $t_1$ of the first film 100, and the depth $h_1$ may be the same as the thickness $t_1$ of the first film 100.

Here, a certain compressive stress may be applied to the first film 100 according to the width $L_1$. However, compared to a case without the first groove 110, an amount of the compressive stress is significantly decreased.

FIGS. 5 through 8 are cross-sectional views that sequentially illustrate a method of manufacturing the flexible display apparatus 1 of FIG. 1, according to an embodiment of the present invention.

Figure 5:
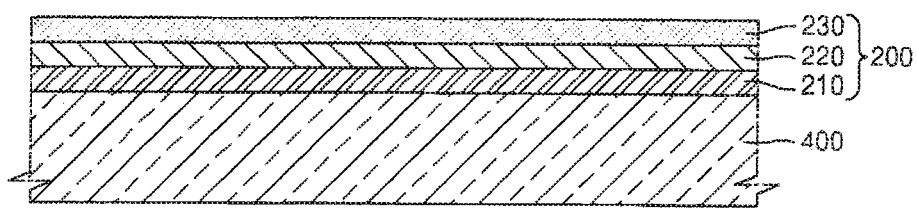
FIGS. 5 through 8 are cross-sectional views that sequentially illustrate a method of manufacturing the flexible display apparatus of FIG. 1, according to an embodiment of the present invention.

Referring to FIG. 5, the display panel unit 200 including the third film 210 having flexibility, the emission display unit 220, and the fourth film 230, together with the third film 230, encapsulating the emission display unit 220 is formed on a supporting substrate 400.

The supporting substrate 400 may be formed of glass. Since the third film 210 having flexibility and formed of a plastic may be deformed due to heat, it is difficult to precisely form the TFT or the emission display unit 220 on the third film 210.

Thus, after the third film 210 is deposited on the supporting substrate 400, a subsequent process may be performed.

The emission display unit 220, in one embodiment, is formed by sequentially forming the pixel electrode 221 (refer to FIG. 2), the organic emission layer 222 (refer to FIG. 2), and the opposite electrode 223 (refer to FIG. 2) on the third film 210, and then the fourth film 230 is formed to cover the emission display unit 220.

The fourth film 230 may be formed as a multi-layered inorganic film, or a thin film including an inorganic film and an organic film.

Figure 6:
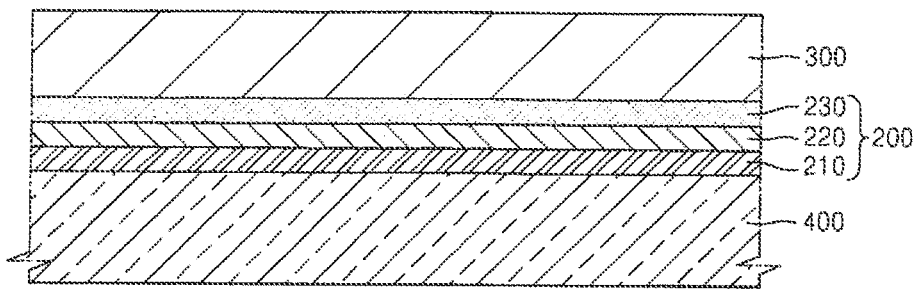

Referring to FIG. 6, the second film 300 having the second rigidity is bonded on the fourth film 230.

The second film 300 may be formed as a flexible film such as a plastic, and an adhesion layer (not shown) to bond the fourth film 230 and the second film 300 may be disposed between the fourth film 230 and the second film 300.

Figure 7:
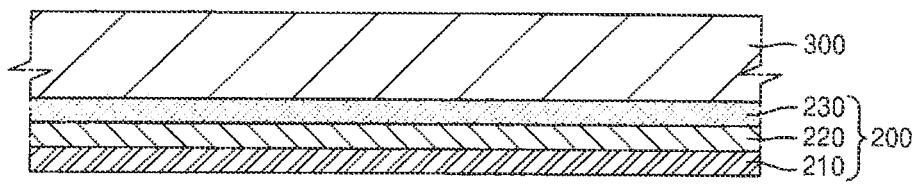

Referring to FIG. 7, the supporting substrate 400 is separated from the third film 210.

The supporting substrate 400 may be separated from the third film 210 by a general method such as etching.

Figure 8:
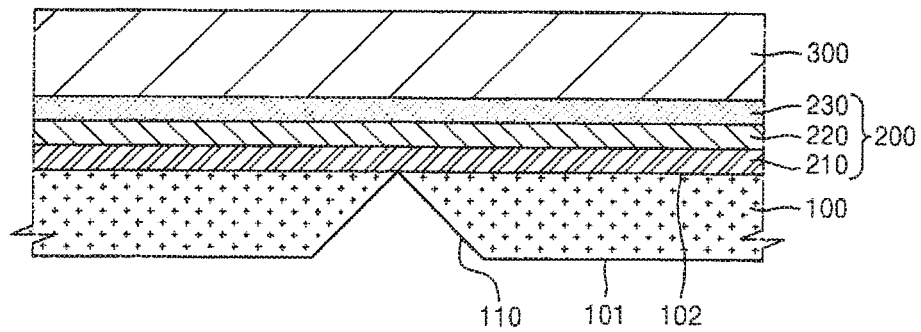

Referring to FIG. 8, the first film 100 that has the first rigidity greater than the second rigidity and that includes the second surface 102 adjacent to the third film 210, and the first surface 101 opposite to the second surface 102 and having the first groove 110 is bonded on a surface opposite to a surface of the third film 210 on which the emission display unit 220 is disposed.

Here, an adhesion layer (not shown) to bond the first film 100 and the third film 210 may be disposed between the first film 100 and the third film 210.

Figure 9:
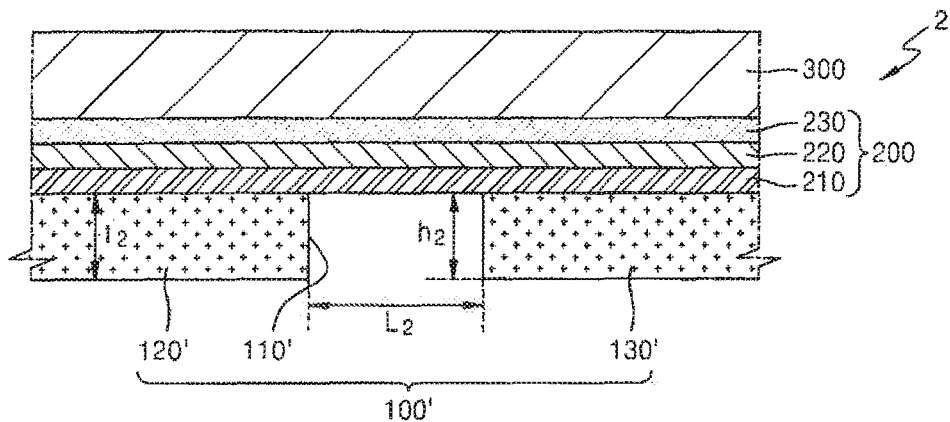
FIG. 9 is a cross-sectional view of a flexible display apparatus according to another embodiment of the present invention.

FIG. 9 is a cross-sectional view of a flexible display apparatus 2 according to another embodiment of the present invention.

Referring to FIG. 9, the flexible display apparatus 2 according to one embodiment is the same as the flexible display apparatus 1 of FIG. 1, except for a configuration of a first film 100'.

The first film 100' has a first groove 110', and a first region 120' and a second region 130' that are separated by the first groove 110'. In one embodiment, a portion of the third film 210 is exposed at a region corresponding to the first groove 110'.

A width $L_2$ and a depth $h_2$ of the first groove 110' included in the first film 100' may have various values according to a bending level.

Figure 10:
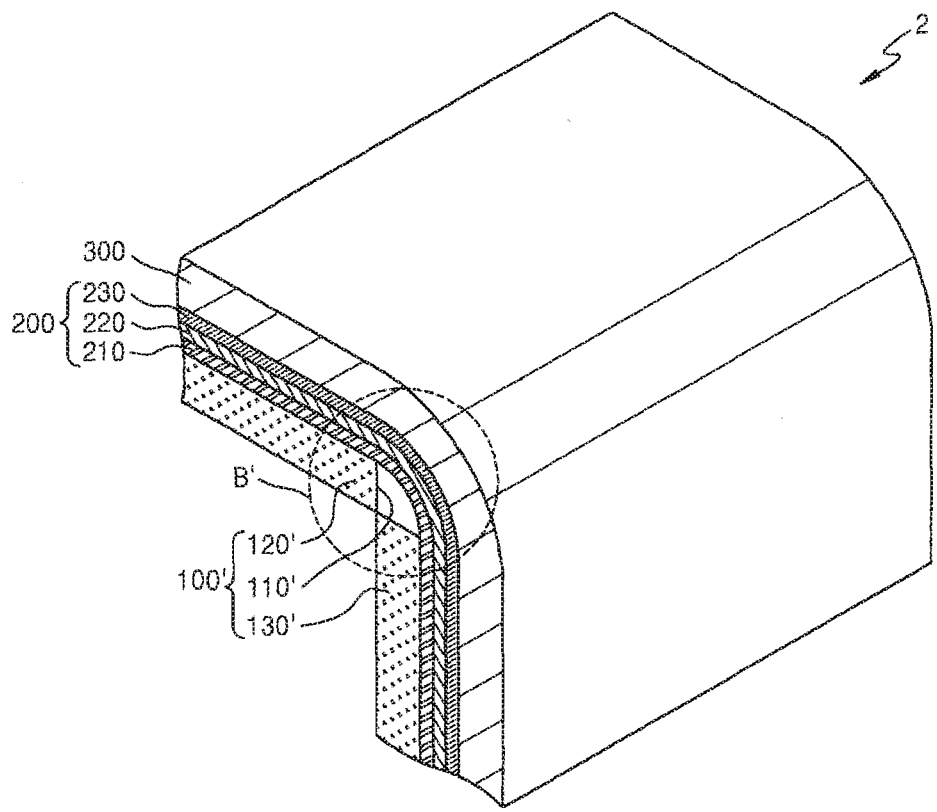
FIGS. 10 and 11 are perspective views illustrating bent states of the flexible display apparatus of FIG. 9.
Figure 11:
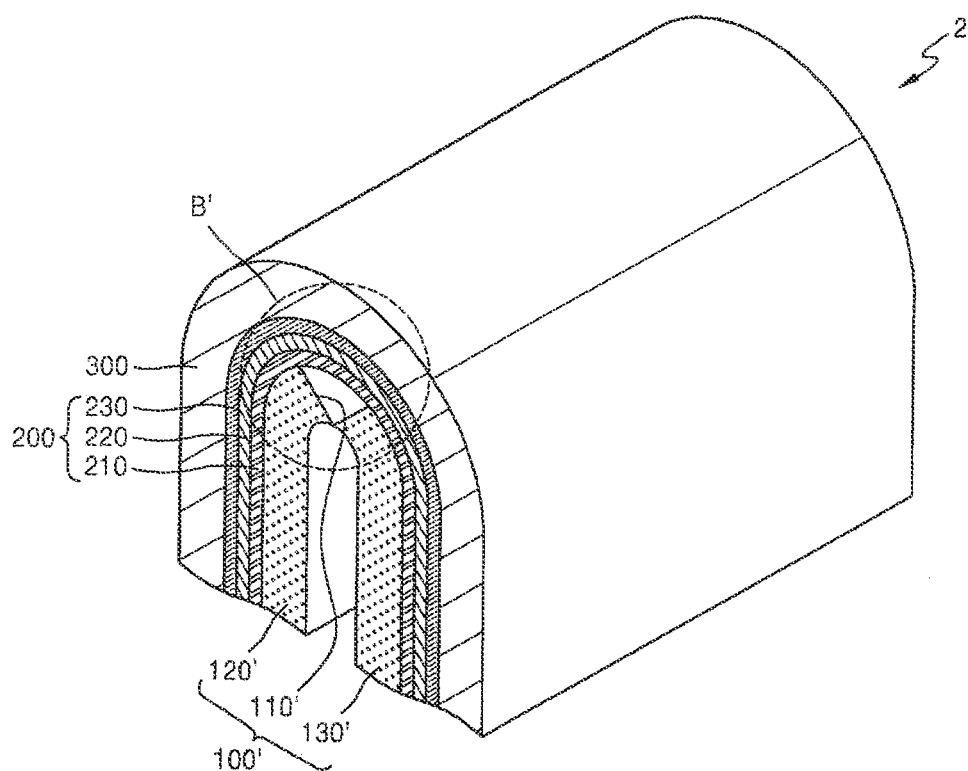

FIGS. 10 and 11 are perspective views illustrating bent states of the flexible display apparatus 2 of FIG. 9.

Referring to FIG. 10, the first film 100' is divided into the first region 120' and the second region 130', and the flexible display apparatus 2 includes a bending portion B' at which the first region 120' and the second region 130' of the first film 100' are bent in an approximately vertical direction.

In one embodiment, the first groove 110' of the first film 100' is disposed at the bending portion B', and the bending portion B' has an empty space surrounded by the first region 120' and the second region 130'.

In one embodiment, the width $L_2$ of the first groove 110' included in the first film 100' may be twice as great as a thickness $t_2$ of the first film 100', i.e. $L_2=2\times t_2$, and the depth $h_2$ may be the same as the thickness $t_2$ of the first film 100', i.e. $h_2=t_2$.

Due to the aforementioned structure, although the flexible display apparatus 2 may be bent as shown in FIG. 10, a compressive stress is not applied to the first film 100'.

Referring to FIG. 11, the first film 100' is divided into the first region 120' and the second region 130', and the flexible display apparatus 2 includes the bending portion B' at which the first region 120' and the second region 130' of the first film 100' are bent in an approximately horizontal direction.

In one embodiment, the first groove 110' of the first film 100' is disposed at the bending portion B', and the bending portion B' has an empty space surrounded by the first region 120' and the second region 130'.

Here, a certain compressive stress may be applied to the first film 100' according to values of the width $L_2$ and the depth $h_2$ of the first groove 110'. However, compared to a case without the first groove 110', a level of the compressive stress is significantly decreased.

Figure 12:
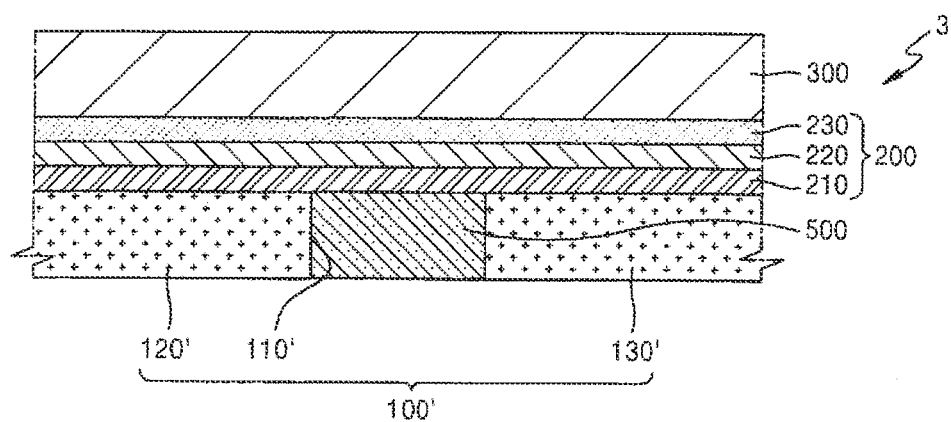
FIG. 12 is a cross-sectional view of a flexible display apparatus according to another embodiment of the present invention.

FIG. 12 is a cross-sectional view of a flexible display apparatus 3 according to another embodiment of the present invention.

Referring to FIG. 12, the flexible display apparatus 3 according to one embodiment is the same as the flexible display apparatus 2 of FIG. 12, except that the flexible display apparatus 3 has an elastic member 500 that is disposed to fill the first groove 110' included in the first film 100'.

The elastic member 500, in one embodiment, is formed of a material having greater flexibility than that of the first film 100'. When the flexible display apparatus 3 is bent, the first groove 110' may be formed at a bending portion (refer to a portion B' in each of FIGS. 13 and 14), i.e. in a region having the greatest compressive stress, and the elastic member 500 may fill the first groove 110' such that a compressive stress is decreased.

Since the elastic member 500 fills the first groove 110', the display panel unit 200 is not externally exposed.

Figure 13:
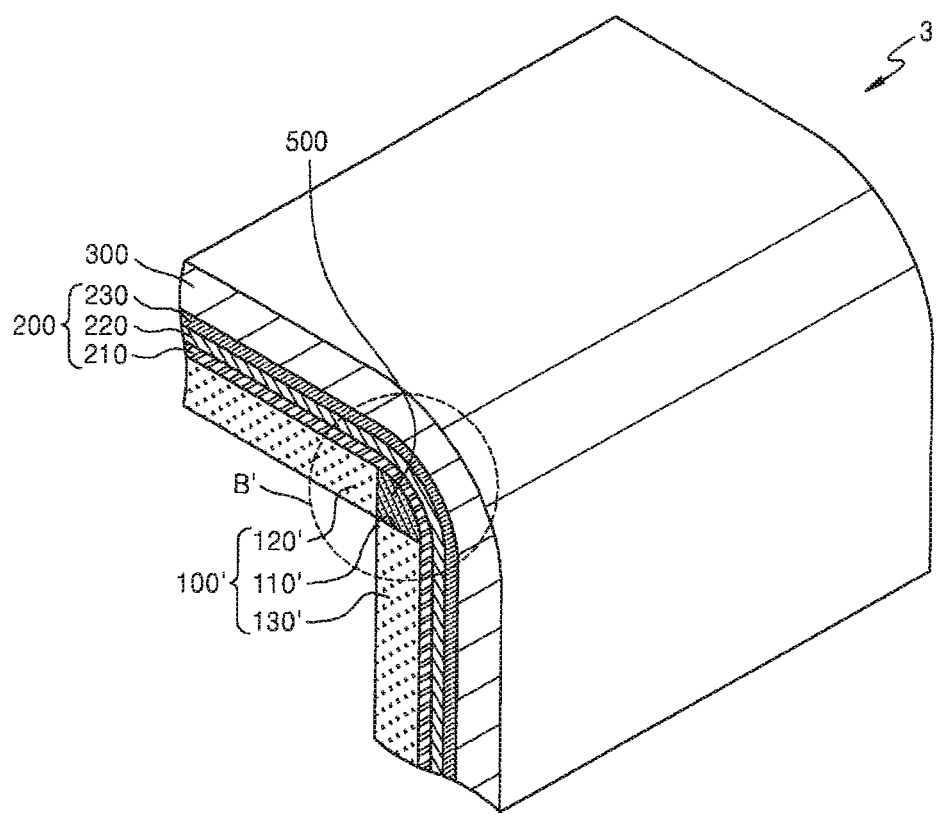
FIGS. 13 and 14 are perspective views illustrating bent states of the flexible display apparatus of FIG. 12.
Figure 14:
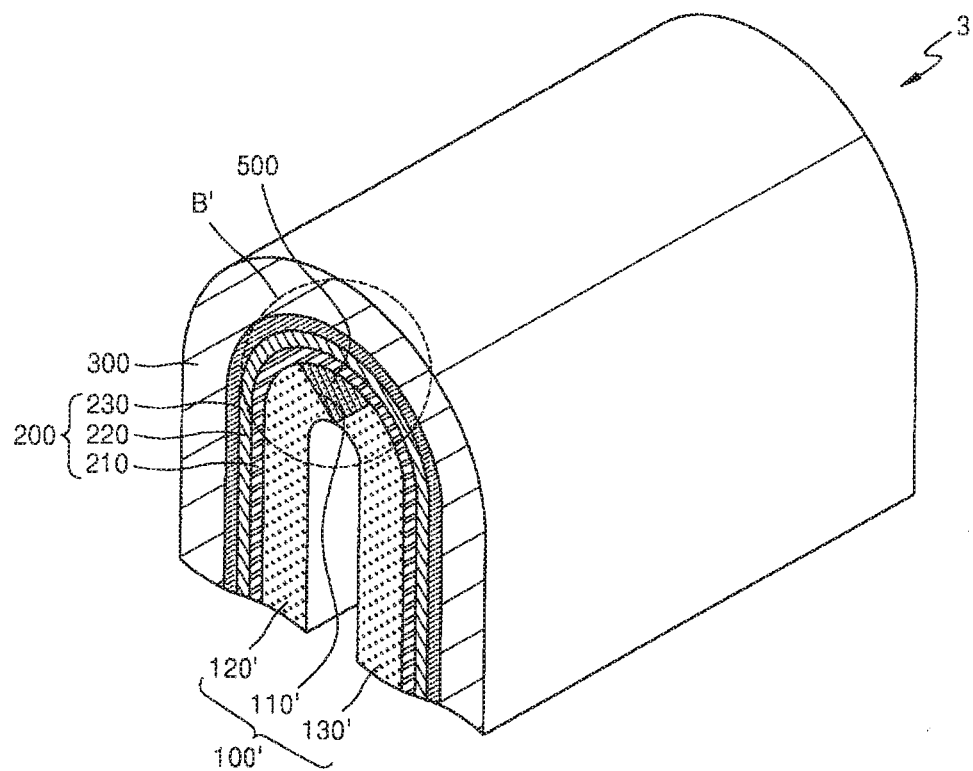

FIGS. 13 and 14 are perspective views illustrating bent states of the flexible display apparatus 3 of FIG. 12.

Referring to FIG. 13, the first film 100' is divided into the first region 120' and the second region 130', and the flexible display apparatus 3 includes the bending portion B' at which the first region 120' and the second region 130' of the first film 100' are bent in an approximately vertical direction.

Here, the first groove 110' of the first film 100' is disposed at the bending portion B', and the elastic member 500 is disposed at a region surrounded by the first region 120' and the second region 130'.

Referring to FIG. 14, the first film 100' is divided into the first region 120' and the second region 130', and the flexible display apparatus 3 includes the bending portion B' at which the first region 120' and the second region 130' of the first film 100' are bent in an approximately horizontal direction.

Here, the first groove 110' of the first film 100' is disposed at the bending portion 13' and the elastic member 500 is disposed at a region surrounded by the first region 120' and the second region 130'.

In the flexible display apparatus 3 according to one embodiment, the elastic member 500 having relatively great flexibility is disposed in the first groove 110' of the first film 100' such that, although the flexible display apparatus 3 may be bent as shown in FIGS. 13 and 14, a stress applied to the first film 100' is decreased.

Figure 15:
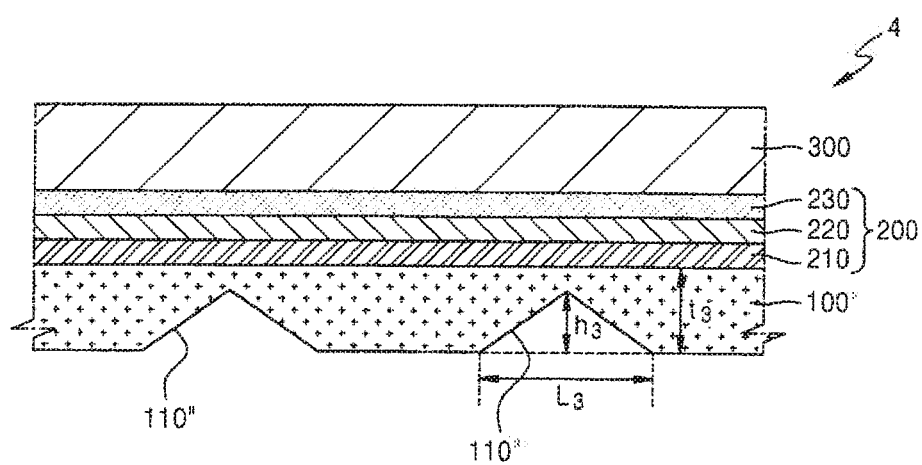
FIG. 15 is a cross-sectional view of a flexible display apparatus according to another embodiment of the present invention.

FIG. 15 is a cross-sectional view of a flexible display apparatus 4 according to another embodiment of the present invention.

Referring to FIG. 15, the flexible display apparatus 4 according to one embodiment is the same as the flexible display apparatus 1 of FIG. 1, except that the flexible display apparatus 4 has a structure in which two first grooves 110" are disposed in a first film 100".

In one embodiment, the first grooves 110" have a constant width $L_3$ and a constant height $h_3$. Here, the height $h_3$ may be less than a thickness $t_3$ of the first film 100", but is not limited thereto.

Figure 16:
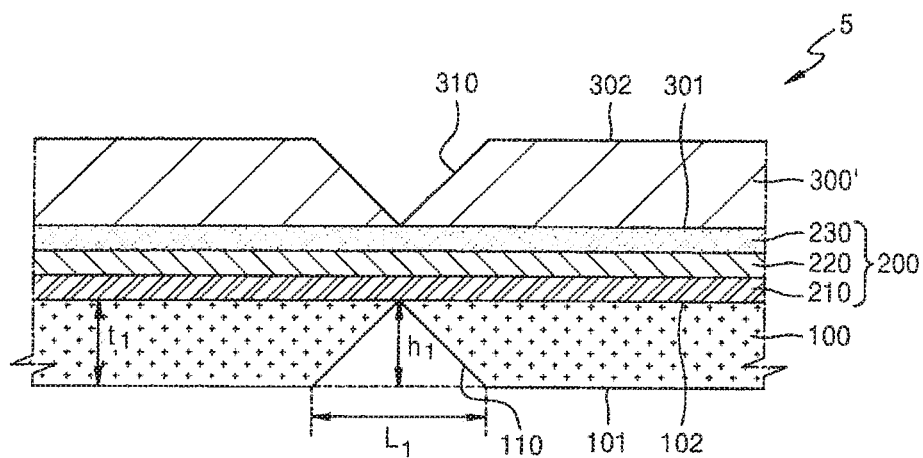
FIG. 16 is a cross-sectional view of a flexible display apparatus according to another embodiment of the present invention.

FIG. 16 is a cross-sectional view of a flexible display apparatus 5 according to another embodiment of the present invention.

Referring to FIG. 16, the flexible display apparatus 5 according to one embodiment is the same as the flexible display apparatus 1 of FIG. 1, except that the flexible display apparatus 5 has a structure in which a second film 300' has the third surface 301 adjacent to the display panel unit 200, and the fourth surface 302 opposite to the third surface 301, and includes a second groove 310 in the fourth surface 302.

In one embodiment, the first groove 110 and the second groove 310 may correspond to each other, but are not limited thereto. The aforementioned description with respect to the first groove 110 may be equally applied to the second groove 310, and thus further description of the second groove 310 is omitted here.

In the flexible display apparatus according to one or more embodiments of the present invention, a groove is disposed in a bending portion of the flexible display apparatus, such that a stress due to a folding or bending operation may be decreased.

Also, by bonding a separate film on the display panel unit, durability of the flexible display apparatus may be improved.

Also, by disposing the emission display unit in a neutral portion, damage of a device formed in the emission display unit, which is caused due to a folding or bending operation, may be prevented or substantially prevented.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A flexible display apparatus comprising;
   a first film including a first surface and a second surface that are opposite each other, and a first groove formed in the first surface, the first film having a first rigidity;
   a third, film on the second surface of the first film;
   a fourth film facing the third film;
   an emission display unit between and encapsulated by the third film and the fourth film; and
   a second film on the fourth film and facing the first film, the second film having a second rigidity that is less than the first rigidity,
   wherein the emission display unit comprises a pixel electrode on the third film, an organic emission layer on the pixel electrode, and an opposite electrode on the organic emission layer,
   wherein the fourth film is on the opposite electrode,
   wherein a width of the first groove is at least two times greater than a thickness of the first film, and
   wherein the first film is bendable by at least 90 degrees at the first groove.

2. The flexile display apparatus of claim 1,
   wherein the flexible display apparatus comprises a neutral portion in which is tensile stress and a compressive stress are not incurred by a force when the force capable of bending the flexible display apparatus is applied to the flexible display apparatus, and
   wherein the emission display unit is positioned at the neutral portion.

3. The flexible display apparatus of claim 1, further comprising a bending portion configured to be bent, wherein the first groove is positioned at the bending portion.

4. The flexible display apparatus of claim 1, wherein the first groove includes a plurality of grooves.

5. The flexible display apparatus of claim 1, wherein the first groove has a V-shape.

6. The flexible display apparatus of claim 5, wherein a depth $h_1$ of the first groove satisfies an equation:

$$0 < h_1 \le t_1,$$

where $t_1$ is the thickness of the first film.

7. The flexible display apparatus of claim 1, wherein the first film is divided by the first groove into a first region and a second region, and a portion of the third film is exposed at a region corresponding to the first groove.

8. The flexible display apparatus of claim 1, further comprising an elastic member in the first groove.

9. The flexible display apparatus of claim 1, wherein the second film includes a third surface adjacent to the fourth film, and a fourth surface opposite the third surface and having a second groove formed therein.

10. The flexible display apparatus of claim 1, wherein the third film has flexibility, and the fourth film is formed as a thin film comprising a multi-layered inorganic or an inorganic film and an organic film.

11. A method of manufacturing a flexible display apparatus, the method comprising:
- forming a third film on a supporting substrate;
- forming an emission display unit on the third film;
- forming a fourth film on the emission display unit;
- forming a second film having a second rigidity on the fourth film;
- separating the supporting substrate from the third film; and
- forming a first film on a surface of the third film opposite to another surface of the third film on which the emission display unit is formed, wherein the first film has a first rigidity greater than the second rigidity and comprises a second surface adjacent to the third film, and a first surface that is opposite to the second surface and has a first groove,
- wherein the emission display unit comprises a pixel electrode on the third film, an organic emission layer on the pixel electrode, and an opposite electrode on the Organic emission layer,
- wherein the fourth film is on the opposite electrode,
- wherein a width of the first groove is at least two times greater than a thickness of the first film, and
- wherein the first film is bendable by at least 90 degrees at the first groove.

12. The method of claim 11,
wherein the flexible display apparatus comprises a neutral portion in which a tensile stress and a compressive stress are not incurred by a force when the force capable of bending the flexible display apparatus is applied to the flexible display apparatus, and
wherein the emission display unit is positioned at the neutral portion.

13. The method of claim 11, wherein forming the first film comprises forming the first film having the first groove such that the first groove is positioned at a bending portion formed in the flexible display apparatus to allow the flexible display apparatus to be bent.

14. The method of claim 11, wherein the first groove includes a plurality of grooves.

15. The method of claim 11, wherein the first groove has a V-shape.

16. The method of claim 15, wherein as depth $h_1$ of the first groove satisfies an equation:

$$0 < h_1 \leq t_1,$$

where $t_1$ is the thickness of the first film.

17. The method of claim 11, wherein the first film is divided by the first groove into a first region and a second region, and a portion of the third film is exposed at a region corresponding to the first groove.

18. The method of claim 11, further comprising forming an elastic member in the first groove.

19. The method of claim 11, wherein the second film has a third surface adjacent to the fourth film, and a fourth surface opposite the third surface and having a second groove formed therein.

20. The method of claim 1, wherein the third film has flexibility, and the fourth film is formed as a thin film comprising a multi-layered inorganic film, or an inorganic film and an organic film.

* * * * *